US010732220B2

(12) United States Patent
Tamura et al.

(10) Patent No.: US 10,732,220 B2
(45) Date of Patent: Aug. 4, 2020

(54) POSITIONING AND FIXING DEVICE (71) Applicant: Tokyo Seimitsu Co., Ltd., Tokyo (JP)

(72) Inventors: Hiroo Tamura, Tokyo (JP); Katsura Tomotaki, Tokyo (JP); Yoshiyuki Yokoyama, Tokyo (JP); Tomohiro Yoshimochi, Tokyo (JP); Masami Takatori, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 15/428,062

(22) Filed: Feb. 8, 2017

(65) Prior Publication Data

US 2017/0146595 A1 May 25, 2017

Related U.S. Application Data (63) Continuation of application No. PCT/JP2014/071382, filed on Aug. 13, 2014.

(51) Int. Cl.
*G01R 31/28* (2006.01)
*G01R 1/04* (2006.01)

(52) U.S. Cl.
CPC ....... *G01R 31/2891* (2013.01); *G01R 1/0491* (2013.01); *G01R 31/2865* (2013.01)

(58) Field of Classification Search
CPC ............ G01R 31/2887; G01R 31/2891; G01R 31/2893; G01R 1/0408
See application file for complete search history.

(56) References Cited

U.S. PATENT DOCUMENTS

2007/0296427 A1 12/2007 Kono
2010/0148715 A1* 6/2010 Yalei .................... G05B 19/19
318/569
2011/0316571 A1 12/2011 Kiyokawa
(Continued)

FOREIGN PATENT DOCUMENTS

JP 11067855 A 3/1999
JP 2007324340 A 12/2007
JP 2010-186998 A 8/2010

OTHER PUBLICATIONS

Tokyo Seimitsu Co., Ltd., International Preliminary Report on Patentability, PCT/JP2014/071382, dated Apr. 24, 2015, 12 pgs.

*Primary Examiner* — Patrick Assouad
*Assistant Examiner* — Feba Pothen
(74) *Attorney, Agent, or Firm* — Morgan, Lewis & Bockius LLP (57) ABSTRACT

Provided is a prober capable of suppressing the increase in installation area and the increase in device cost, and also improving the throughput, while maintaining the accuracy of the moving position of an alignment device shared by each of measuring units. The prober includes: a plurality of measuring units, each of which has a probe card electrically connected to a test head; a wafer chuck that holds a wafer in which a plurality of chips are formed; an alignment device which performs relative alignment between the probe card and the wafer held by the wafer chuck; a moving device which moves the alignment device among the measuring units; and a positioning and fixing device which is provided for every of the measuring units, and positions and fixes the alignment device which is moved to each of the measuring units.

5 Claims, 9 Drawing Sheets (56) References Cited

U.S. PATENT DOCUMENTS

| | | | |
|---|---|---|---|
| 2012/0242359 A1* | 9/2012 | Obi | G01R 31/2891 |
| | | | 324/750.16 |
| 2014/0083468 A1* | 3/2014 | Miyazaki | H01L 21/67046 |
| | | | 134/82 |
| 2014/0160270 A1* | 6/2014 | Naito | H01L 21/681 |
| | | | 348/87 |

* cited by examiner

POSITIONING AND FIXING DEVICE

CROSS-REFERENCE TO RELATED APPLICATIONS

The present application is a Continuation of PCT International Application No. PCT/JP2014/071382 filed on Aug. 13, 2014. The above application is hereby expressly incorporated by reference, in its entirety, into the present application.

BACKGROUND OF THE INVENTION

Field of the Invention

The present invention relates to a prober for inspecting electrical characteristics of a plurality of semiconductor devices (chips) formed on a semiconductor wafer, and more particularly to a prober in which an alignment device can be shared by a plurality of measuring units, and to a probe inspection method.

Description of the Related Art

In a semiconductor manufacturing process, there are many processes, and in order to improve quality assurance and yield, various inspections are performed in various manufacturing processes. For example, wafer level inspection is performed in such a manner that, in a stage where a plurality of chips for semiconductor devices are formed on a semiconductor wafer, electrode pads of semiconductor devices on respective chips are connected to a test head, and electric power and test signals are supplied to the electrode pads from the test head. Signals outputted from the semiconductor device are measured by the test head to electrically inspect whether or not the semiconductor devices normally work.

After the wafer level inspection, the wafer is attached to a frame and cut to individual chips by a dicer. Among the cut chips, only the chips which have been confirmed to properly work are respectively packaged in the next assembly process, and hence, the malfunctioning chips are removed from the assembly process. Further, packaged final products are subjected to a shipping inspection.

The wafer level inspection is performed by using a prober in which probes are brought into contact with the electrode pads of each of the chips on the wafer. After the probes are electrically connected to the terminals of the test head, electric power and test signals are supplied to each of the chips from the test head via the probes, and also, the output signals from each of the chips are detected by the test head to measure whether or not the chips normally work.

In the semiconductor manufacturing process, in order to reduce manufacturing cost, the size enlargement of a wafer and further miniaturization (integration) have been advanced, and thereby, the number of chips formed on one wafer has been significantly increased. Accordingly, the time required to inspect one wafer with the prober has been increased, as a result of which the improvement of throughput has been requested. In order to improve the throughput, the multi-probing, in which a number of probes are provided to enable a plurality of chips to be inspected at the same time, has been performed. In recent years, the number of chips to be inspected simultaneously is further increasing and efforts have been made to simultaneously inspect all the chips on one wafer. For this reason, the allowable error in contact alignment between the electrode pad and the probe is reduced, and hence, it is required to improve the position accuracy at the time when the prober is moved.

On the other hand, as the easiest method for increasing the throughput, it is conceivable to increase the number of probers. However, when the number of probers is increased, there arises a problem that the installation area of the probers in the production line is also increased. Further, when the number of probers is increased, the device cost is also increased correspondingly. For this reason, it is required to increase the throughput while suppressing the increase in installation area and the increase in device cost.

Under such background, for example, Japanese Patent Application Laid-Open No. 2010-186998 (hereinafter, referred to as PTL 1) proposes a testing device which has a plurality of measuring units each having a probe card electrically connected to a test head. The testing device is configured such that an alignment device which performs relative alignment between a wafer and the probe card, can be moved among the measuring units.

SUMMARY OF THE INVENTION

However, although the testing device described in PTL 1 allows the measuring units to share one alignment device to achieve space saving and cost reduction, the testing device has the following problem.

That is, when the moving distance of the alignment device is increased, a moving mechanism which moves the alignment device to each of the measuring units and a support member (frame) to which the moving mechanism is attached, are easily distorted due to the weight of the alignment device itself and thermal expansion or thermal contraction. This becomes a cause of reduction of the position accuracy of the alignment device moved to each of the measurement units. For this reason, much time is taken to detect the positions of the electrode pads and the probes on the wafer by use of imaging means, which results in a problem that the time period for aligning operation is increased, and thereby the throughput becomes low.

The present invention has been made in view of the above-described circumstances. The present invention aims to provide a prober and a probe inspection method capable of suppressing the increase in installation area and the increase in device cost, and improving the throughput, while maintaining the accuracy of the moving position of the alignment device shared among the measuring units.

In order to achieve the above-described object, a prober according to the present invention includes: a plurality of measuring units, each of which has a probe card configured to be electrically connected to a test head; a wafer chuck configured to hold a wafer on which a plurality of chips are formed; an alignment device configured to perform relative alignment between the probe card and the wafer held by the wafer chuck; a moving device which moves the alignment device among the measuring units; and positioning and fixing devices which are respectively provided for the measuring units, each of the positioning and fixing devices being configured to position and fix the alignment device which is moved to each of the measuring units.

In an aspect of the prober according to the present invention, the positioning and fixing device includes a clamp mechanism by which at least three places of the alignment device are positioned and then gripped and fixed attachably and detachably.

In an aspect of the prober according to the present invention, the positioning and fixing device includes a positioning unit configured to position at least three places of the alignment device.

In an aspect of the prober according to the present invention, the positioning and fixing device includes a holding unit which is provided separately from the positioning unit and is configured to attachably and detachably hold the alignment device at one or more places.

In an aspect of the prober according to the present invention, the positioning and fixing device includes a height adjusting unit configured to adjust a horizontal direction of the alignment device.

In an aspect of the prober according to the present invention, the alignment device includes a first imaging unit configured to image the wafer, and a second imaging unit configured to image the probe card.

In an aspect of the prober according to the present invention, the moving device moves the alignment device by a belt drive mechanism.

In an aspect of the prober according to the present invention, the plurality of the measuring units are two-dimensionally arranged along a first direction and a second direction orthogonal to the first direction. Further, the first direction or the second direction may be a vertical direction.

Further, in order to achieve the above described object, a probe inspection method according to the present invention is a probe inspection method by a prober including a plurality of measuring units, each of which has a probe card configured to be electrically connected to a test head; a wafer chuck configured to hold a wafer on which a plurality of chips are formed; and an alignment device configured to perform relative alignment between the probe card and the wafer held by the wafer chuck, the probe inspection method comprising: a moving step of moving the alignment device among the measuring units, a positioning and fixing step of positioning and fixing the alignment device which is moved to each of the measuring units; and an alignment step in which, of performing relative alignment between the probe card and the wafer held by the wafer chuck by the alignment device in a state where the alignment device is positioned and fixed.

According to the present invention, there is provided the positioning and fixing device, which positions and fixes the alignment device that is moved to each of the measuring units, and hence, it is possible to suppress the increase in installation area and the increase in device cost, and also to improve the throughput while maintaining the accuracy of the moving position of the alignment device.

DESCRIPTION OF THE EMBODIMENTS

In the following, preferred embodiments according to the present invention will be described with reference to the accompanying drawings.

Figure 1:
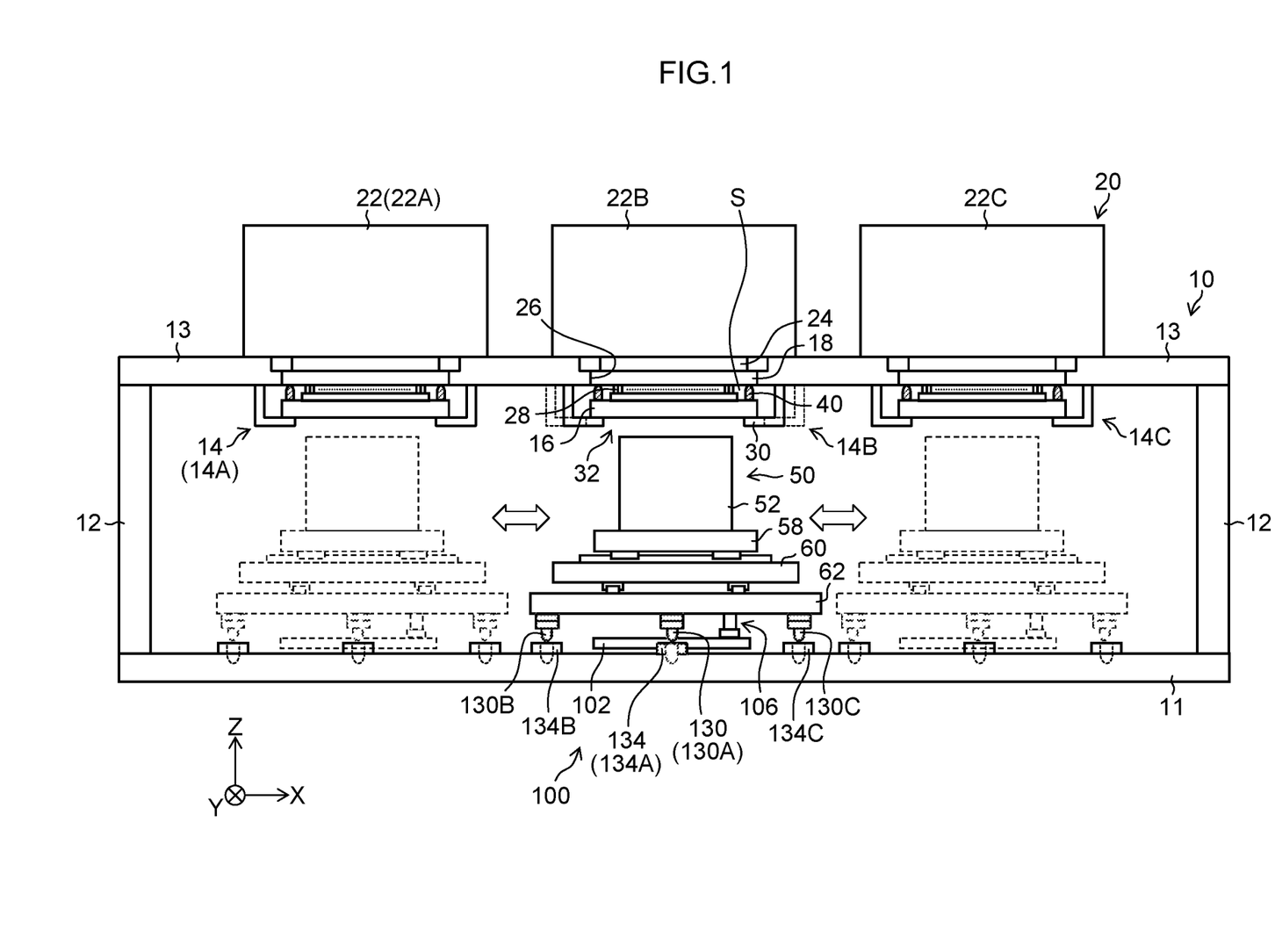
FIG. 1 shows a schematic configuration of a system which performs wafer level inspection according to an embodiment of the present invention.

FIG. 1 shows a schematic configuration of a system which performs wafer level inspection according to an embodiment of the present invention. The system which performs wafer level inspection includes: a prober 10 which brings probes into contact with electrode pads of each of chips on a wafer; and a tester 20 which is electrically connected to the probes and which, for electrical inspection, supplies electric power and test signals to each of the chips and detects output signals from each of the chips to measure whether or not the chips work normally.

In FIG. 1, the housing of the prober 10 is configured by a base part 11, side plate 12, and a head stage 13. There is also a case where an upper plate supported by the side plate 12 is provided and the head stage 13 is provided on the upper plate.

The prober 10 is provided with a plurality of measuring units (first to third measuring units) 14A to 14C. Each of the measuring units 14A to 14C is provided with: a wafer chuck 16 which holds a wafer W; and a probe card 18 having probes 28, the number of which corresponds to the electrodes of each of the chips of the wafer W. In each of the measuring units 14A to 14C, all of the chips on the wafer W held by the wafer chuck 16 are simultaneously inspected. It should be noted that the configurations of the measuring units 14A to 14C are the same, and hence, in the following, the measuring unit is representatively designated by reference numeral 14 on behalf of the measuring units 14A to 14C.

Figure 2:
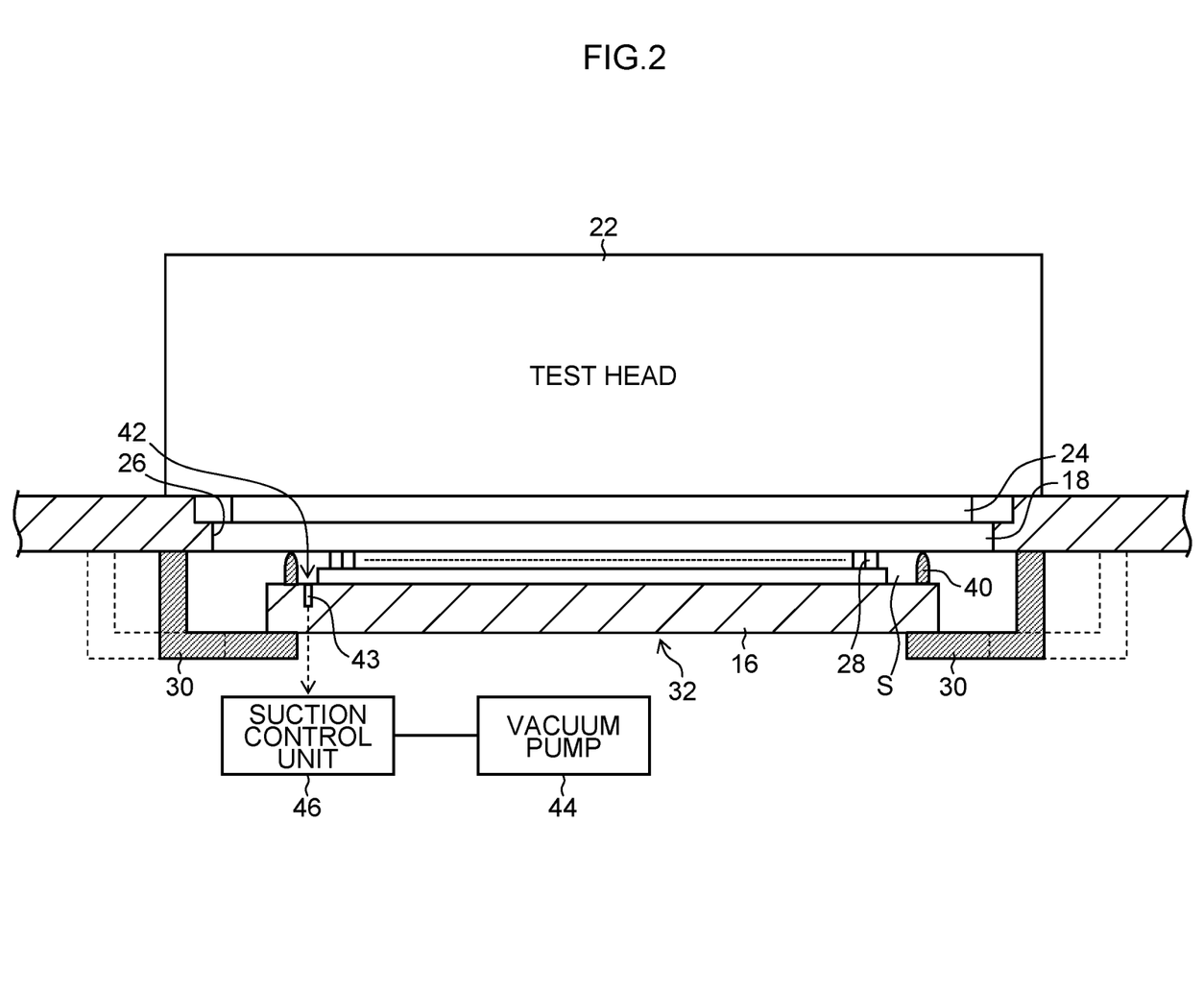
FIG. 2 shows a configuration of a periphery of a probe card.

FIG. 2 shows a configuration of the periphery of a probe card.

The wafer chuck 16 sucks and fixes the wafer by vacuum suction or the like. The wafer chuck 16 is attachably and detachably supported by an alignment device 50 described below, and can be moved in the X-Y-Z-θ direction by the alignment device 50.

The wafer chuck 16 is provided with a sealing mechanism. The sealing mechanism is provided with an elastic ring-shaped sealing member 40 which is provided near the outer periphery of the upper surface of the wafer chuck 16. Further, on the upper surface of the wafer chuck 16, a suction port 42 is provided between the wafer W and the ring-shaped sealing members 40. The suction port 42 is connected to a suction control unit 46 which controls vacuum pressure via a suction passage 43 formed in the inside of the wafer chuck 16. The suction control unit 46 is connected to a vacuum pump 44. When, in the state in which the ring-shaped sealing member 40 is in contact with the probe card 18, the suction control unit 46 is operated, a sealed interior space S formed between the probe card 18 and the wafer chuck 16 is decompressed, so that the wafer chuck 16 is attracted toward the probe card 18. Thereby, the probe card 18 and the wafer chuck 16 are brought into close contact with each other, so that each of the probes 28 is brought into contact with each of the electrode pads of each of the chips, to be in a state where the inspection can be started.

In the head stage 13, a mounting hole (card mounting part) 26 is provided at each of the measuring units 14, and each of the probe cards 18 is interchangeably attached to each of the mounting holes 26. In the probe card 18, there are provided a plurality of the spring-pin type elastic probes 28 which are formed to respectively correspond to all electrodes of the chip, at portions which face respective chips on the wafer W. It should be noted that, here, a configuration in which the probe card 18 is directly attached to the head stage 13 is shown, but there is also a case where a card holder is provided at the head stage 13, and the probe card 18 is attached to the card holder.

The tester 20 has a plurality of test heads 22 (22A to 22C), each of which is provided at each of the measuring units 14. Each of the test heads 22 is placed on the upper surface of the head stages 13. It should be noted that there is also a case where each of the test heads 22 is held above the head stage 13 by a support mechanism (not shown).

The terminals of each of the test head 22 are respectively correspondingly connected to the terminals of the probe card 18 via a number of connecting pins of a contact ring 24. Thereby, the terminals of each of the test heads 22 are in a state of being electrically connected to the probes 28.

Each of the measuring units 14 is provided with a support mechanism (chuck disengagement prevention mechanism) for preventing disengagement of the wafer chuck 16. The support mechanism is provided with a plurality of holding parts 30 for holding the wafer chuck 16. The holding parts 30 are provided at predetermined intervals around the circumference of the mounting hole 26 of the head stage 13. In the present embodiment, four holding parts 30 are provided at intervals of 90 degrees along the circumference of the mounting hole 26 (only two holding parts 30 are shown in FIG. 1 and FIG. 2).

Each of the holding parts 30 is configured such that the holding parts 30, which are opposite to each other with respect to the center of the mounting hole 26, can be movable (expandable the diameter) so as to be approached to each other or separated from each other. The moving mechanism (not shown) of each of the holding parts 30 is configured, for example, by a ball screw, a motor, or the like. In a state in which the holding parts 30 are approached to each other (the state shown by solid lines in FIG. 1 and FIG. 2), the inner diameter of a passing hole 32, which is formed in a center part of the holding parts 30, is smaller than the diameter of the wafer chuck 16, and hence, the wafer chuck 16 is held by each of the holding parts 30. On the other hand, in a state in which the holding parts 30 are separated from each other (the state shown by dashed lines in FIG. 1 and FIG. 2), the inner diameter of the passing hole 32 is larger than the diameter of the wafer chuck 16, and hence, the alignment device 50 can supply or recover the wafer chuck 16.

It should be noted that, as the configuration of the support mechanism, various modifications can be adopted as described in PTL 1 described above.

The prober 10 according to the present embodiment includes: the alignment device 50 which attachably and detachably supports the wafer chuck 16 and performs alignment of the wafer W held by the wafer chuck 16; and a moving device 100 which moves the alignment device 50 among the measuring units 14 along the direction (X-axis direction) in which each of the measuring units 14 is arranged.

The alignment device 50 includes: a moving and rotating mechanism which moves the wafer chuck 16 in the X-Y-Z-θ direction; and an alignment mechanism which detects the relative positional relationship between each of the electrodes of each of the chips on the wafer W held by the wafer chuck 16, and each of the probes 28 of the probe card 18. Also, the alignment device 50 attachably and detachably supports the wafer chuck 16 and performs alignment of the wafer W held by the wafer chuck 16. That is, the alignment device 50 detects the relative positional relationship between each of the electrodes of each of the chips of the wafer W held by the wafer chuck 16, and each of the probes 28 of the probe card 18, and then moves the wafer chuck 16 on the basis of the detection results so that each of the electrodes of the chip to be inspected is brought into contact with each of the probes 28.

The alignment device 50 sucks and fixes the wafer chuck 16 by vacuum suction, or the like. The alignment device 50 may have any kind of fixing means other than vacuum suction, as long as the wafer chuck 16 can be fixed. For example, the fixing means may be mechanical means and so on. Further, the alignment device 50 is provided with a positioning member (not shown) by which the relative positional relationship with respect to the wafer chuck 16 is always kept to be constant.

Figure 3:
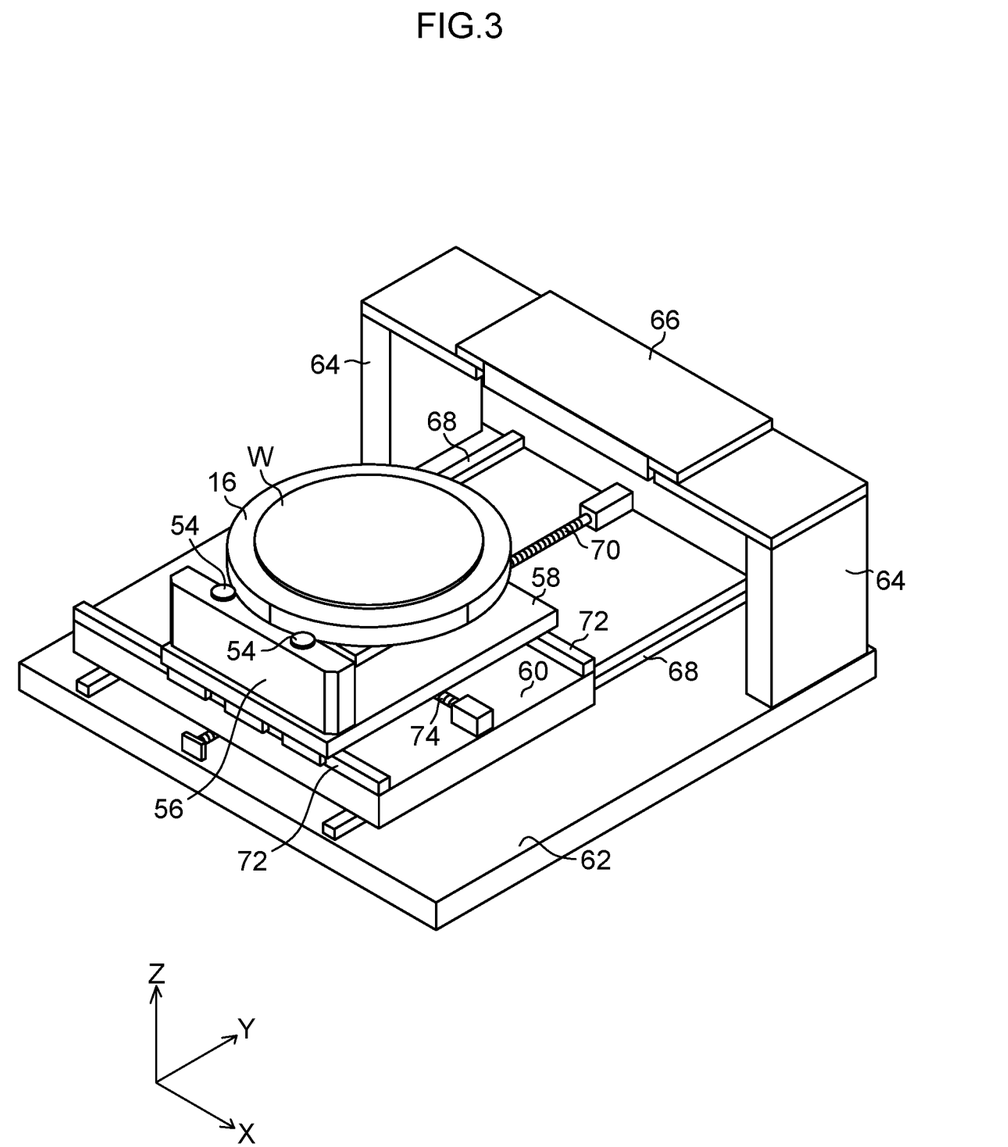
FIG. 3 is a perspective view seen from above and showing a schematic configuration of an alignment device.
Figure 4:
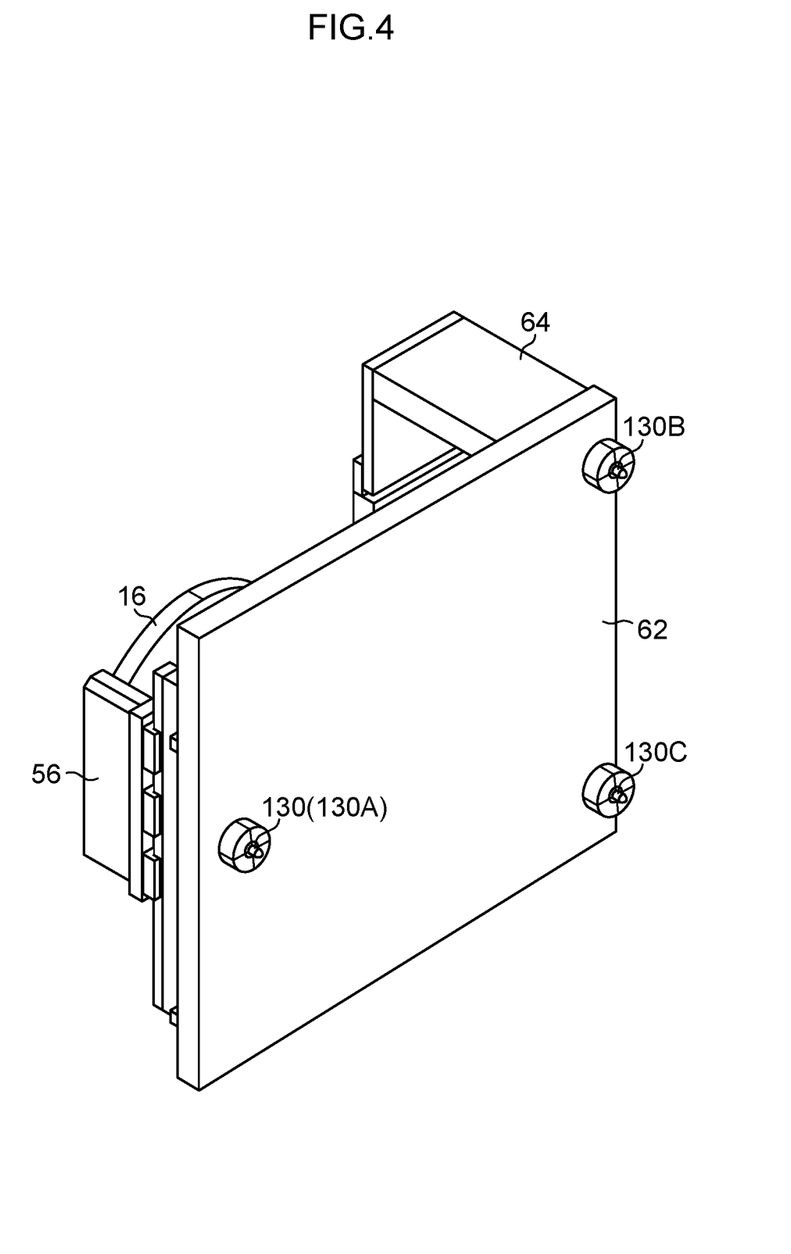
FIG. 4 is a perspective view seen from below and showing the schematic configuration of the alignment device.

Each of FIG. 3 and FIG. 4 shows the schematic configuration of the alignment device 50. Specifically, FIG. 3 is a perspective view from above of the alignment device 50, and FIG. 4 is a perspective view from below of the alignment device 50. It should be noted that each of FIG. 3 and FIG. 4 shows a state in which the wafer chuck 16 is supported on the upper surface of the alignment device 50.

As shown in FIG. 1 and FIG. 3, the alignment device 50 includes: a Z-axis moving and rotating unit 52 which attachably and detachably supports the wafer chuck 16 to move the wafer chuck 16 in the Z-axis direction and rotate the wafer chuck 16 about the Z-axis; a probe position detecting camera 54 which detects the position of the probe 28; a camera moving mechanism 56 which moves the probe position detecting camera 54 in the Z-axis direction; a X-axis moving table 58 by which the Z-axis moving and rotating unit 52 and the camera moving mechanism 56 are supported and moved in the X-axis direction; a Y-axis moving table 60 by which the X-axis moving table 58 is supported and moved in the Y-axis direction; a base 62 which supports the Y-axis moving table 60; and an alignment camera 66 which is supported by a support post 64. A moving and rotating mechanism, which moves the wafer chuck 16 in the X-Y-Z-θ direction, is configured by the Z-axis moving and rotating unit 52, the X-axis moving table 58, and the Y-axis moving table 60. Further, the alignment mechanism is configured by the probe position detecting camera 54, the alignment camera 66, the camera moving mechanism 56, and an image processing unit (not shown).

Two guide rails 68 are formed in parallel with each other on the base 62, and the Y-axis moving table 60 is movable on the guide rails 68. A drive motor and a ball screw 70 which is rotated by the drive motor are provided at portions between the two guide rails 68 on the base 62. The ball screw 70 is engaged with the bottom surface of the Y-axis moving table 60, and the Y-axis moving table 60 is slid on the guide rails 68 by rotation of the ball screw 70.

Two guide rails 72, which are in parallel with each other and perpendicular to the above-described two guide rails 68, are provided on the Y-axis moving table 60, and the X-axis moving table 58 is movable on the guide rails 72. A drive motor and a ball screw 74 which is rotated by the drive motor are provided between the two guide rails 72 on the Y-axis moving table 60. The ball screw 74 is engaged with the bottom surface of the X-axis moving table 58, and the X-axis moving table 58 is slid on the guide rails 72 by rotation of the ball screw 74.

It should be noted that there is also a case where a linear motor is used instead of the ball screw.

Next, a configuration of the moving device 100 will be described.

As shown in FIG. 1, the moving device 100 includes a conveying pallet 102 which places and conveys the alignment device 50. The conveying pallet 102 is configured to be able to move among the measuring units 14 in the X-axis direction. A moving mechanism (horizontal feeding mechanism), which moves the conveying pallet 102, may be any kind of mechanism as long as it is a linearly moving mechanism, and may be configured, for example, by a belt drive mechanism, a linear guide mechanism, a ball screw mechanism, or the like. Further, the conveying pallet 102 is provided with a lifting mechanism 106 which moves up and down the alignment device 50 in the Z-axis direction. The lifting mechanism 106 is configured by a known cylinder mechanism, or the like. Thereby, the alignment device 50 is configured to be movable among the measuring units 14 in the X-axis direction and also to be movable up and down in the Z-axis direction. It should be noted that the moving mechanism of the conveying pallet 102 and the lifting mechanism 106 are driven by control performed by a control means (not shown).

Figure 5:
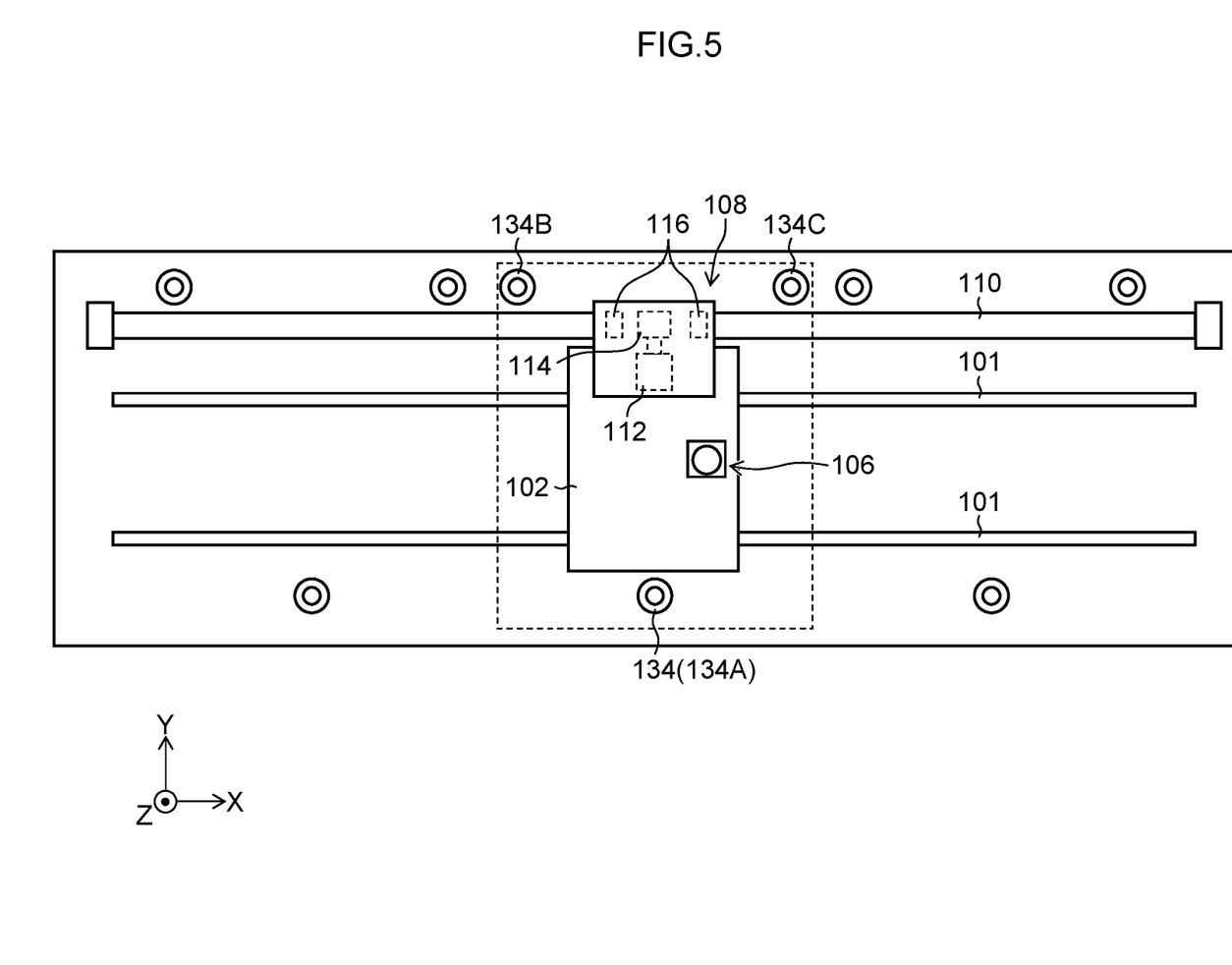
FIG. 5 is a plan view schematically showing a configuration example of a movement device.
Figure 6:
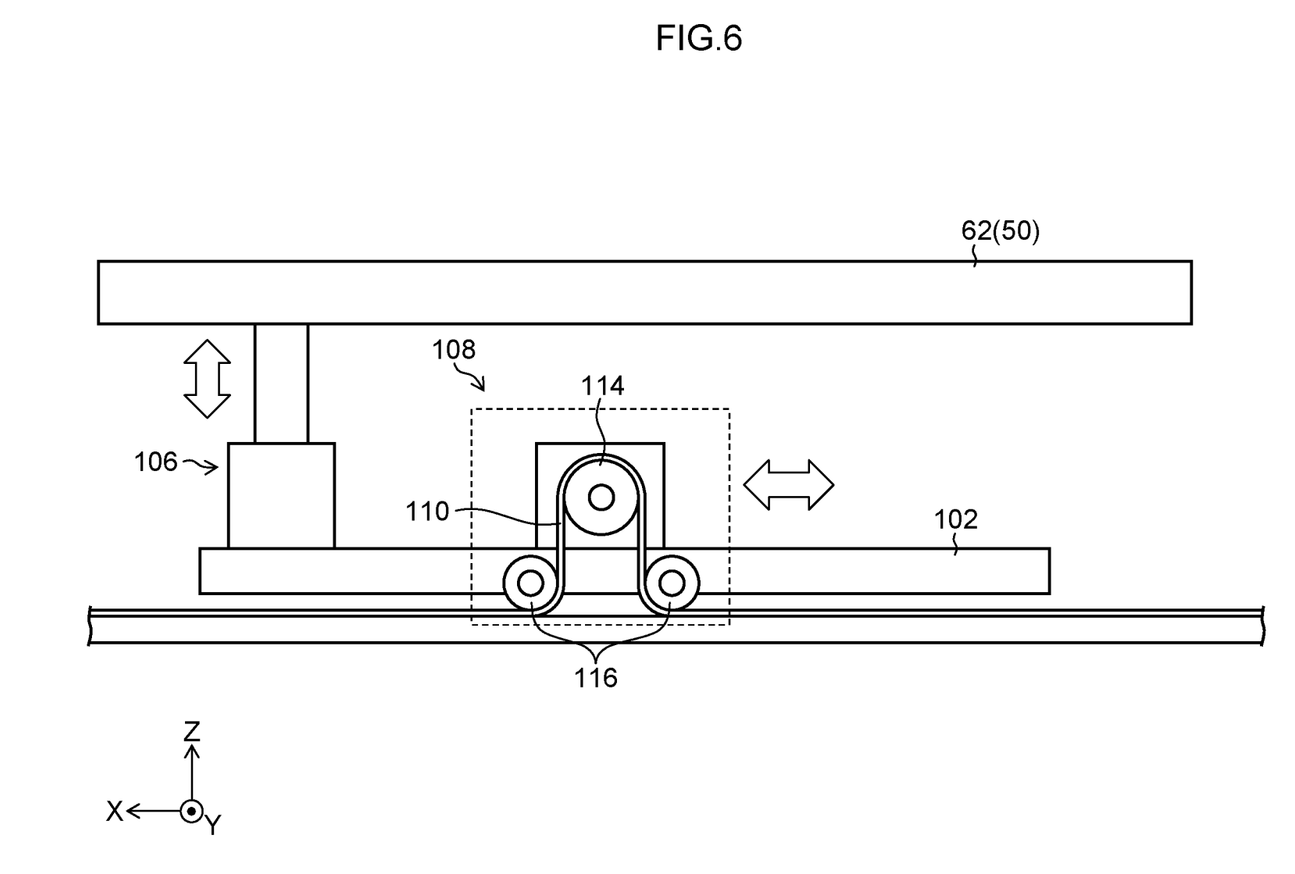
FIG. 6 is a side view schematically showing the configuration example of the movement device.

Each of FIG. 5 and FIG. 6 is a schematic view showing a configuration example of the moving device 100. Specifically, FIG. 5 is a plan view of the moving device 100, and FIG. 6 is a side view of the moving device 100.

As shown in FIG. 5 and FIG. 6, two guide rails 101 are provided in parallel with each other on the base part 11, and the conveying pallet 102 is movable on the guide rails 101. Further, timing belts 110, each of which is in parallel with the guide rails 101 and have both ends fixed to the base part 11, are provided at the outer portions of the two guide rails 101.

A driving unit 108 is fixed to the conveying pallet 102. The driving unit 108 includes a driving motor 112, a drive pulley 114 which is connected to the rotating shaft of the driving motor 112, and two idle pulleys 116 which are arranged in the vicinity of the drive pulley 114. The timing belt 110 is wound around the drive pulley 114, and the tension of the timing belt 110 is adjusted by the idle pulleys 116 which are arranged on both sides of the timing belt 110. When the driving motor 112 is driven, the conveying pallet 102 is slid on the guide rails 101 by rotation of the drive pulley 114. Thereby, the alignment device 50, which is supported by the conveying pallet 102, is moved among the measuring units 14 in the X-axis direction.

Figure 7:
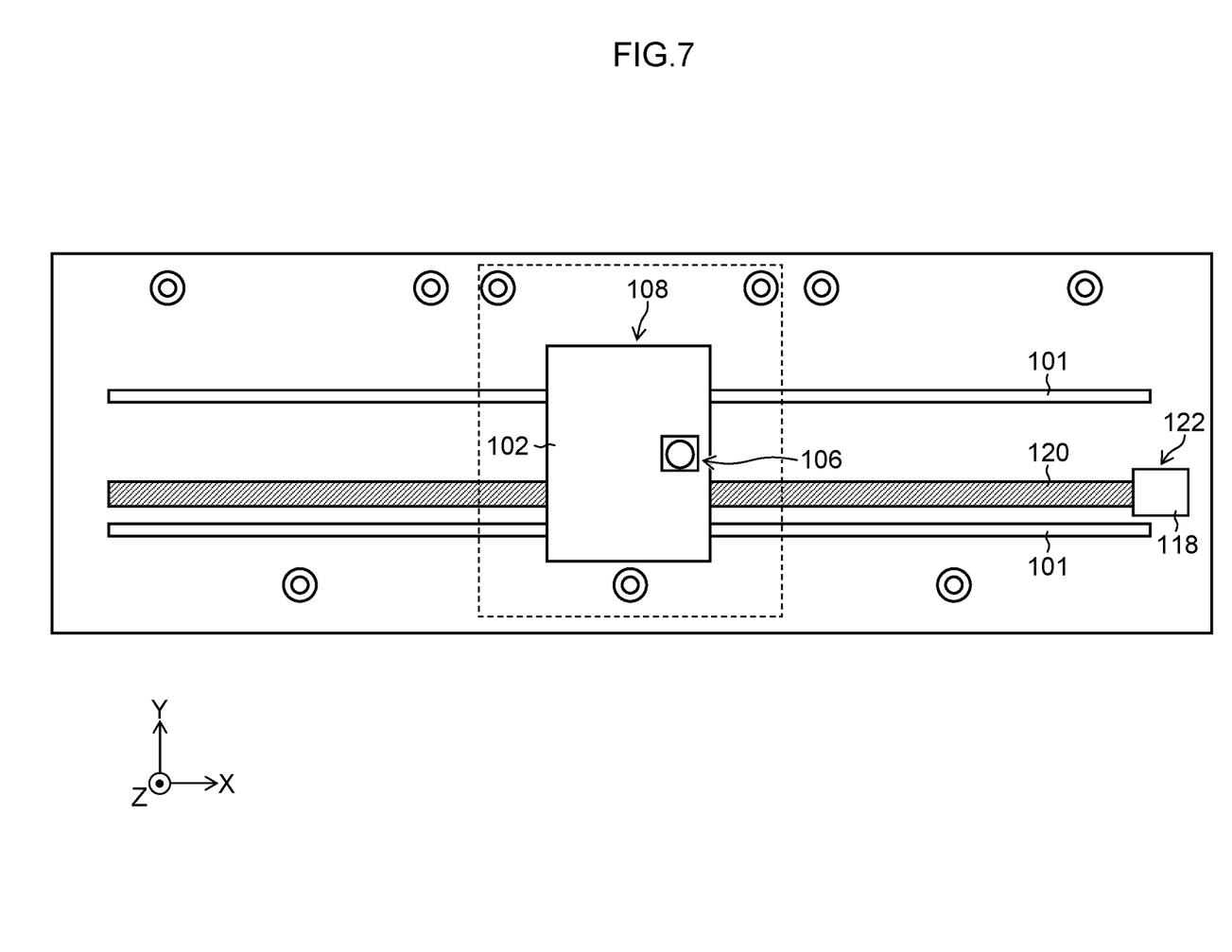
FIG. 7 is a plan view schematically showing another configuration example of the movement device.

FIG. 7 is a schematic view showing another configuration example of the moving device 100. The configuration example shown in FIG. 7 uses a ball screw mechanism. That is, on the base part 11, a driving unit, which is configured by a driving motor 118 and a ball screw 120, is provided between the two guide rails 101. The ball screw 120 is engaged with the bottom surface of the conveying pallet 102, and the conveying pallet 102 is slid on the guide rails 101 by rotation of the ball screw 120. Thereby, the alignment device 50, which is supported by the conveying pallet 102, is moved among the measuring units 14 in the X-axis direction.

In the present embodiment, there is provided a positioning and fixing device having a clamp mechanism. The positioning and fixing device positions three places of the alignment device 50, which is moved to each of the measuring units 14, and grips and fixes the alignment device 50 attachably and detachably. Specifically, in the alignment device 50, a plurality of positioning pins 130 (130A to 130C) are provided at three places of the base 62. On the other hand, a plurality of chuck members (positioning holes) 134 (134A to 134C), which respectively clamp the positioning pins 130, are provided on the base part 11 of the housing, and the chuck members 134 are provided for each of the measuring units 14. The clamping mechanism is configured by the positioning pins 130 and the chuck members 134.

It should be noted that, as the clamping mechanism, a known clamping mechanism such as a ball lock system or a tapered sleeve system can be applied, and hence, the description thereof is omitted here.

Figure 8:
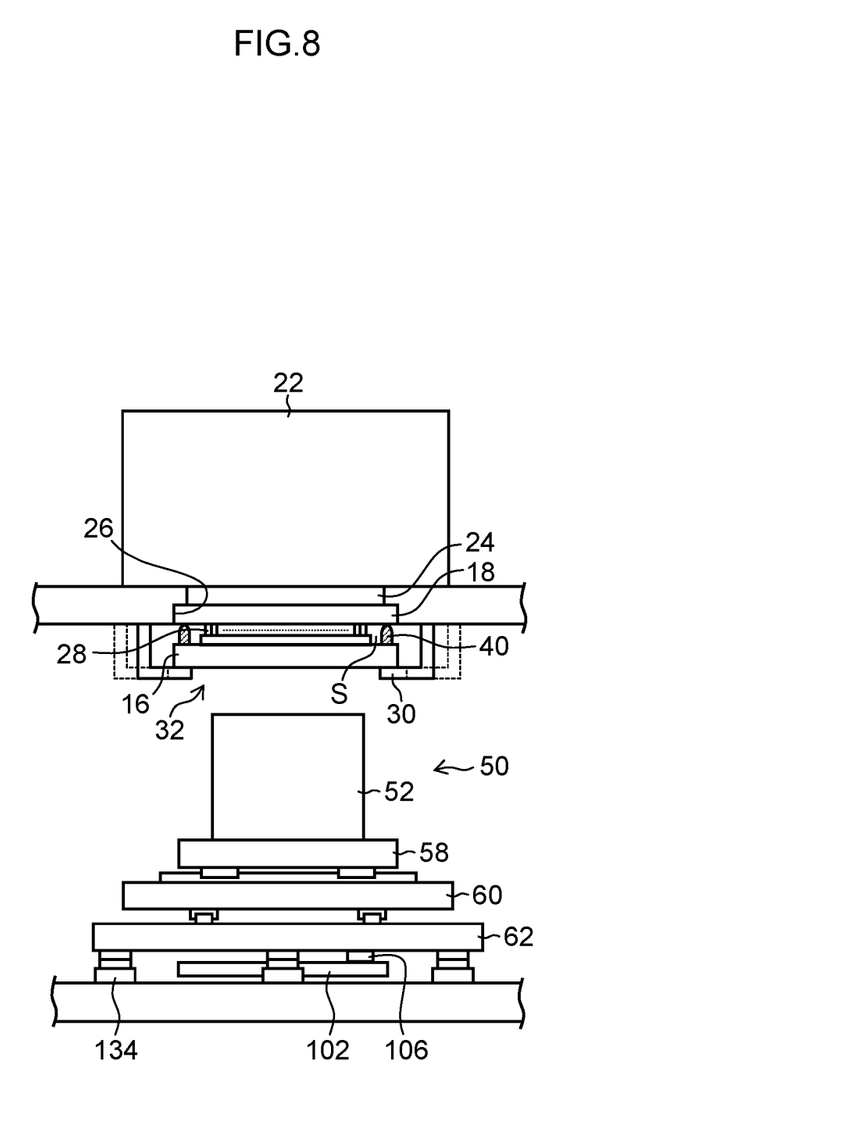
FIG. 8 shows a state in which the alignment device is positioned and fixed.

When the alignment device 50, which is moved to each of the measuring units 14, is positioned and fixed, the alignment device 50 is lowered by the lifting mechanism 106 so that the positioning pins 130 are respectively fitted and clamped to the chuck members 134 in a corresponding manner as shown in FIG. 8. Thereby, the alignment device 50 is positioned in the horizontal direction and the vertical direction, and also, the alignment device 50 is fixed to the base part 11 in the state in which the rotation of the alignment device 50 around the vertical direction is restrained. On the other hand, when the alignment device 50 is moved to the other measuring unit 14, the alignment device 50 is moved upward by the lifting mechanism 106, so that the positioning pins 130 are respectively disengaged from the chuck members 134. Thereby, the positioning and fixing of the alignment device 50 are released, so that the alignment device 50 is able to be moved to the other measuring unit 14 by the moving device 100.

Next, the inspection operation using the probers of the present embodiment will be described.

First, the alignment device 50 is moved to the measuring unit 14 which performs inspection from now, and is positioned and fixed. Then, the Z-axis moving and rotating unit 52 is moved upward so that the wafer chuck 16 is held by the alignment device 50. In this state, the reduction of pressure in the interior space S is released by the suction control unit 46, and the mutually facing holding parts 30 of the support mechanism are separated from each other. Then, the wafer chuck 16 is moved downward by the Z-axis moving and rotating unit 52.

Next, the alignment device 50, which supports the wafer chuck 16, is moved to a predetermined delivery position, and then, the wafer W is loaded to the wafer chuck 16 by a wafer delivery mechanism (loader) (not shown), to be fixed by vacuum suction.

Next, aligning operation is performed. Specifically, the X-axis moving table 58 is moved so that the probe position detecting camera 54 is located under the probe 28. Then, the probe position detecting camera 54 is moved in the Z-axis direction by the camera moving mechanism 56 so as to be focused, and the tip end position of the probe 28 is detected by the probe position detecting camera 54. The positions (X and Y coordinates) of the tip end of the probe 28 in the horizontal plane are detected from the coordinates of the camera, and the position of the tip end of the probe 28 in the vertical direction is detected from the focus position of the camera. It should be noted that, since the probe card 18 is usually provided with hundreds or thousands or more of the probes 28, the tip end positions of all the probes 28 are usually not detected, and the tip end positions of specific probes are detected.

Next, in a state in which the wafer W to be inspected is held by the wafer chuck 16, the X-axis moving table 58 is moved to allow the wafer W to be located under the alignment camera 66, so that the positions of the electrode pads of each of the chips of the wafer W are detected. The positions of all the electrode pads of one chip need not be detected, but the positions of some of the electrode pads may be detected. Further, the positions of the electrode pads of all the chips on the wafer W need not be detected, but the positions of the electrode pads of some of the chips may be detected.

Next, on the basis of the arrangements of the probes 28 and the arrangements of the electrode pads, which have been detected as described above, the wafer chuck 16 is rotated by the Z-axis moving and rotating unit 52 so that the arrangement direction of the probes 28 coincide with the arrangement direction of the electrode pads. Then, in order that the electrode pads of the chip to be inspected are located under the probes 28, the wafer chuck 16 is moved in the X-axis direction and the Y-axis direction, and then, the wafer chuck 16 is moved upward in the Z-axis direction by the Z-axis moving and rotating unit 52.

In this state, when the wafer chuck 16 is moved upwardly to the height at which the electrode pads corresponding to the probes are brought into contact with the probes, the upward movement of the wafer chuck 16 is stopped. At this time, the ring-shaped sealing member 40 is brought into contact with the probe card 18, so that the sealed interior space S is formed between the probe card 18 and the wafer chuck 16. Further, when the pressure in the interior space S is reduced by operation of the suction control unit 46, the wafer chuck 16 is attracted toward the probe card 18, and thereby, the probe card 18 is brought into close contact with the wafer chuck 16, so that the probes 28 of the probe card 18 are respectively brought into contact with the electrode pads with uniform contact pressure.

On the other hand, when the pressure in the internal space S is reduced by the vacuum pump 44 so that the probe card 18 is brought into close contact with the wafer chuck 16, the Z-axis moving and rotating unit 52 is moved downward in the Z-axis direction, and the wafer chuck 16 is seceded from the alignment device 50. Further, the mutually facing holding parts 30 of the support mechanism are brought in a state of being approached to each other in order to prevent the disengagement of the wafer chuck 16.

Next, the test head 22 performs the electrical operation inspection by supplying electric power and test signals to each of the chips of the wafer W, and detecting signals outputted from the chips.

Subsequently, similarly to the procedure described above, also in each of the other measuring units 14, the wafer W is loaded on the wafer chuck 16, and then, after the aligning operation and the contact operation are completed at each of the measuring units 14, the simultaneous inspection of each of the chips of the wafer W are sequentially performed. That is, the test head 22 supplies electric power and test signals to each of the chips of the wafer W, and detects signals outputted from the chips to perform the electrical operation inspection. It should be noted that the inspection may also be performed in a state in which the wafer chuck 16 is supported by the alignment device 50.

When the inspection is completed at each of the measuring units 14, the alignment device 50 is sequentially moved to each of the measuring units 14 to collect the wafer chuck 16 which holds the wafer W which have been inspected.

That is, when the inspection is completed at each of the measuring units 14, the alignment device 50 is moved to the measuring unit 14 which has finished its inspection operation. Then, after the alignment device 50 is positioned and fixed, the Z-axis moving and rotating unit 52 is moved upward in the Z-axis direction, so that the wafer chuck 16 is supported by the alignment device 50. Then, the decompression in the interior space S is released by the suction control unit 46, and specifically, atmospheric air is introduced into the interior space S. Thereby, the close contact state between the probe card 18 and the wafer chuck 16 is released. Further, each of the holding parts 30 of the support mechanism is set in the diameter-expanded state. Thereafter, the wafer chuck 16 is moved downward in the Z-axis direction by the Z-axis moving and rotating unit 52, and the positioning and fixing of the alignment device 50 is released. Then, the alignment device 50 is moved to a predetermined delivery position, and the fixation of the wafer W which has been inspected is released to unload the wafer W from the wafer chuck 16. The unloaded wafer W is collected by the delivery mechanism.

It should be noted that, in the present embodiment, as shown in FIG. 1, one wafer chuck 16 is assigned to each of the measuring units 14, but a plurality of the wafer chucks 16 may be used among a plurality of the measuring units 14.

In this way, in the present embodiment, since the positioning and fixing device, which positions and fixes the alignment device 50 shared by each of the measuring units 14, is provided at each of the measuring units 14, the position repeatability of the alignment device 50, which is moved to each of the measuring units 14, is extremely high, so that the positions of the electrode pads on the wafer W, and the positions of the probes 28 can be easily detected, and thereby the alignment time can be reduced. Therefore, while the accuracy of the moving position of the alignment device 50 is maintained, the throughput can be improved by suppressing the increase in the installation area and the device cost.

Further, in the present embodiment, it is not necessary that the aligning operation is performed from the beginning each time the wafer W is exchanged, and hence, a part of the aligning operation can be simplified. For example, it is possible that, at the time of inspecting the first wafer W, the alignment data for detecting the relative positional relationship between the wafer W and the probe card 18 is stored, and at the time of inspecting the second wafer W or later, the relative positioning between the wafer W and the probe card 18 is performed on the basis of the alignment data acquired at the time of the inspection of the first wafer W.

Further, in the present embodiment, the positioning and fixing device is provided, and thereby, the positional accuracy of the movement of the alignment device 50 can be ensured, so that a belt drive mechanism, which is difficult to move with relatively high accuracy, can be preferably used as the moving device 100.

Further, in the present embodiment, the positioning and fixing device includes the clamp mechanism by which the alignment device 50 is positioned at three places thereof and is attachably and detachably gripped and fixed. Therefore, the alignment device 50 is positioned in the horizontal direction and the vertical direction by a so-called three-point support configuration. Also, in the state in which the rotation of the alignment device 50 around the vertical direction is restrained, the alignment device 50 can be fixed to the base part 11. Thereby, every time when the alignment device 50 is moved to each of the measuring units 14, the alignment device 50 can be positioned and fixed with high accuracy at the same position of each of the measuring units 14.

It should be noted that, in the present embodiment, a configuration, in which three places of the alignment device 50 are positioned and fixed by the clamp mechanism, is shown. However, the positioning and fixing of the alignment device 50 is not limited to the three places, and a configuration, in which the alignment device 50 is positioned and fixed at four or more places by the clamp mechanism, may also be used, as long as the alignment device 50 can be positioned and fixed in the horizontal direction, the vertical direction, and the rotation direction around the vertical direction.

Further, in the present embodiment, the positioning and fixing of the alignment device 50 are performed at the same three places by the clamp mechanism, but the positioning places need not be the same as the fixing places. It is possible to use a configuration in which the positioning places are separated from the fixing places.

For example, in the state in which the alignment device 50 is positioned at three places in the horizontal direction, the vertical direction, and the rotation direction around the vertical direction (that is, the state in which the alignment device 50 is not fixed), the alignment device 50 may be held by known holding means at one or more places different from these positions. As the holding means, it is preferable to use, for example, a configuration in which the front and back surfaces of the base 62 are sandwiched from the upper and lower directions by the urging force of elastic members, such as torsion coil springs.

Further, in the present embodiment, as the clamp mechanism, it is preferable to use a height adjusting mechanism which adjusts the alignment device 50 in the horizontal direction. As the height adjusting mechanism, it is possible to use, for example, a known screw-type height adjusting mechanism using a pressing screw (setscrew) or a pulling screw (tensile screw). Thereby, for example, even when the surface accuracy of the base part 11, to which the alignment device 50 is fixed, is deteriorated due to deformation, the parallel adjustment of the alignment device 50 can be performed by the height adjusting mechanism, and hence, the deterioration in the alignment accuracy can be prevented.

Further, in the present embodiment, the alignment camera 66 (first imaging means) and the probe position detecting camera 54 (second imaging means) are mounted to the alignment device 50. For this reason, as compared with the case in which the imaging means are provided at each of the measuring units 14, the imaging means hardly receive the influence of heat distortion, and the like, caused by the difference in temperature change between the measuring units 14, and hence, the relative positional deviation between the alignment camera 66 and the probe position detecting camera 54 is suppressed. Therefore, the aligning operation can be performed with high precision and in a short time.

Further, the present embodiment shows the configuration in which the three measuring units 14 are arranged in the X-axis direction, but the number and arrangement of the measuring units 14 are not limited in particular. For example, a plurality of the measuring units 14 may be arranged in a two-dimensional manner in the X-axis direction and the Y-axis direction.

Figure 9:
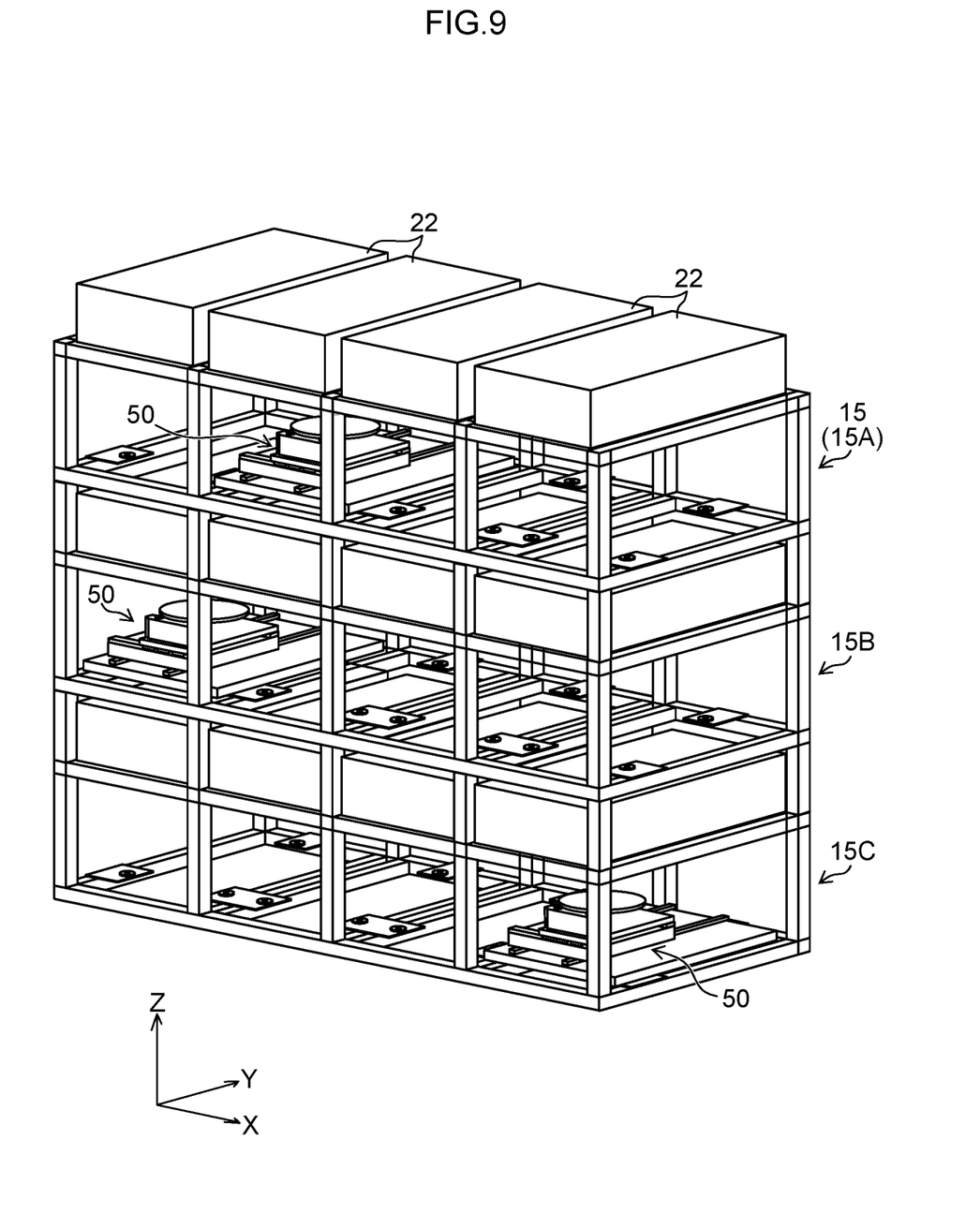
FIG. 9 shows a configuration in which measuring unit groups, each having a plurality of measuring units, are stacked vertically.

Further, a multistage configuration, in which measuring unit groups, each formed of a plurality of the measuring units 14, are stacked in the Z-axis direction, may also be used. For example, FIG. 9 shows a configuration example in which measuring unit groups 15 (15A to 15C), each formed of the four measuring units 14, are stacked in three stages in the Z-axis direction. In this configuration, the alignment device 50 is provided for each of the measuring unit groups 15, and the alignment device 50 is shared by the measuring units 14 in one measuring unit group 15. It should be noted that it may be configured such that the alignment device 50 is shared by all the measuring units 14. With such configuration, it is possible that the footprint of the entire device is reduced, and processing capability per unit area is increased, so that the cost is reduced.

In the above, the prober and the probe inspection method according to the present invention are described, but the present invention is not limited to the above described embodiments, and various modifications and variations are possible within the scope and spirit of the present invention.

What is claimed is:

1. A positioning and fixing device which positions and fixes an alignment device, the alignment device being configured to be movable along guide rails among a plurality of measuring units and being configured to perform relative alignment between a measurement target and each of the plurality of measuring units, the positioning and fixing device comprising a plurality of positioning and fixing units respectively provided for the plurality of measuring units, each of the positioning and fixing units being configured to position and fix in a horizontal direction and a vertical direction, a base of the alignment device which is moved to each of the plurality of measuring units, wherein the plurality of positioning and fixing units includes a plurality of engaging members provided for each measuring unit and configured to define and fix a position of the base of the alignment device in the horizontal direction and the vertical direction, and the base of the alignment device includes a plurality of engaged members to be mechanically engaged with the plurality of engaging members, the plurality of engaging members being provided at positions other than the guide rails.

2. The positioning and fixing device according to claim 1, wherein each of the positioning and fixing units includes a clamp mechanism which is configured to position at least three places of the base of the alignment device, and is configured to grip and fix the base of the alignment device attachably and detachably.

3. The positioning and fixing device according to claim 1, wherein each of the positioning and fixing units includes a positioning unit configured to position at least three places of the base of the alignment device.

4. The positioning and fixing device according to claim 3, wherein each of the positioning and fixing units includes a holding unit which is provided separately from the positioning unit and is configured to attachably and detachably hold the base of the alignment device at one or more places.

5. The positioning and fixing device according to claim 1, wherein each of the positioning and fixing units includes a height adjusting unit configured to adjust a horizontal direction of the base of the alignment device.

* * * * *